United States Patent [19]

Yasui et al.

[11] 4,258,465

[45] Mar. 31, 1981

[54] METHOD FOR FABRICATION OF OFFSET GATE MIS DEVICE

[75] Inventors: Tokumasa Yasui; Minoru Fukuda, both of Kodaira; Tatsumi Shirasu, Tokyo, all of Japan

[73] Assignee: Hitachi, Ltd., Tokyo, Japan

[21] Appl. No.: 909,942

[22] Filed: May 26, 1978

Related U.S. Application Data

[63] Continuation of Ser. No. 809,106, Jun. 22, 1977, abandoned.

[30] Foreign Application Priority Data

Jun. 23, 1976 [JP] Japan .................................. 51-73174

[51] Int. Cl.³ .............................................. B01J 17/00
[52] U.S. Cl. .................................. 29/571; 29/576 B; 29/578; 148/187; 357/59; 357/91
[58] Field of Search ..................... 29/571, 578, 577 B; 148/187; 357/23, 59, 91

[56] References Cited

U.S. PATENT DOCUMENTS

| | | | |
|---|---|---|---|
| 3,533,158 | 10/1970 | Bower | 29/571 |
| 3,739,237 | 6/1973 | Shannon | 29/571 |
| 3,747,203 | 7/1973 | Shannon | 29/578 |
| 3,787,962 | 1/1974 | Yoshida | 357/23 |
| 3,996,657 | 12/1976 | Simko | 357/59 |
| 4,033,026 | 7/1977 | Pashley | 29/578 |
| 4,075,754 | 2/1978 | Cook | 29/571 |

Primary Examiner—W. C. Tupman
Attorney, Agent, or Firm—Craig and Antonelli

[57] ABSTRACT

An offset gate MIS device is fabricated by forming an insulating film with a gate insulator portion as a part thereof on the surface of a semiconductor substrate having one conductivity type, providing a gate electrode on a portion of the insulating film, using the gate electrode as a mask to apply impurities of the other conductivity type with a first impurity concentration to the surface of the semiconductor substrate through the insulating film, forming a shielding film on the surface of that portion of the insulating film which is near the gate insulator portion beneath the gate electrode, using the shielding film as a mask to remove an unmasked portion of the insulating film so as to selectively expose the surface of the semiconductor substrate, applying impurities of the other conductivity type with a second impurity concentration higher than the first impurity concentration to the exposed surface of the semiconductor substrate, and heating the resultant structure to diffuse the impurities into the semiconductor substrate to form source and drain regions therein.

31 Claims, 9 Drawing Figures

METHOD FOR FABRICATION OF OFFSET GATE MIS DEVICE

This is a continuation of application Ser. No. 809,106 filed June 22, 1977, now abandoned.

LIST OF PRIOR ART REFERENCES UNDER 37 CFR 1.56(a)

The following references are cited to show the state of the art;

(1) U.S. Pat. No. 3,787,962 to Isao Yoshida et al, Jan. 29, 1974, Class 29, subclasses 571 and 578;

(2) U.S. Pat. No. 3,745,425 to Julian R. A. Beale et al, July 10, 1973, subclasses 235R, 235B, and 235AM and Class 148, subclass 175;

(3) U.S. Pat. No. 3,679,492 to Frank F. Fang et al, July 25, 1972, Class 148-1.5; and (4) C. S. Chang et al, IBM Technical Disclosure Bulletin, Vol. 16, No. 5, October, 1973, pages 1635-1636.

BACKGROUND OF THE INVENTION

1. Field of the Invention

This invention relates to a method for fabrication of a MIS device and more particularly an offset gate MIS device.

2. Description of the Prior Art

According to the conventional method of fabricating a silicon gate MISFET, a gate electrode pattern is formed by photoetching on a polycrystalline silicon layer which lies on a gate insulator film, the unwanted portion of the gate insulator film is removed in a self-alignment fashion by using the gate electrode as a mask, and source and drain regions are formed through the selective diffusion of impurities. Consequently, the integration density and the characteristics, especially the operating speed, can be considerably improved in comparison with those of an aluminum gate MISFET.

However, according to the conventional method for fabrication f a silicon gate MISFET, the source and drain regions are formed by using the gate electrode as a mask so that the drain region of offset configuration cannot be formed. Accordingly, an inverse electric field due to the substrate-drain junction and the gate-drain field are applied near the portion of the drain region beneath the gate electrode so that a depletion or space charge layer extending from the drain toward the substrate does not expand sufficiently near the surface of the substrate. As a result, local concentrations of field are generated to be causative of avalanche breakdowns. This makes difficult the production of devices having a high breakdown voltage. This weakpoint is therefore fatal to a silicon gate MISFET having various excellent characteristics and merits.

There is known an aluminum gate MISFET in which source and drain regions of low impurity concentration are provided to insure good ohmic contact with source and drain electrodes, and source and drain extensions of high impurity concentration are provided to improve the source-drain breakdown voltage (see U.S. Pat. No. 3,959,025).

A silicon gate MISFET having a drain region of offset configuration is known in U.S. Pat. No. 3,909,306. In accordance with the fabrication method shown in this patent, a silicon oxide layer formed on a N-type silicon substrate is partially removed to diffuse P-type impurities into the exposed surface of the substrate through inpurity ion implantation and heat treatment so that a P-type drain region having a low impurity concentration and a thickness of 5-10$\mu$ is formed. During the diffusion, a silicon oxide layer is formed on the substrate surface in which the P-type drain region is formed. Next, there are removed those portions of the silicon oxide layer overlying a central surface portion of the P-type low impurity concentration drain region and that surface portion of the substrate in which a source region and a channel region are to be formed. The exposed substrate surface is thereafter oxidized to form a gate oxide film of silicon oxide. A polycrystalline silicon layer is formed on the gate oxide film and the remaining silicon oxide layer. The polycrystalline silicon layer is then partially removed so that a portion thereof on the channel region remains for forming a gate electrode. Further, the gate oxide film is partially removed so that the surface portion of the substrate for forming the source region and the central surface portion of the P-type low impurity concentration drain region are exposed. Thereafter, P-type impurities are diffused into the exposed substrate surface so that a P$^+$-type source region (P-type high impurity concentration source region) and a P$^+$-type drain region (P-type high impurity concentration drain region) in the P-type low impurity concentration drain region are formed with a thickness of about 1$\mu$. Thus, The gate electrode is formed to bridge the source region and the drain region of low impurity concentration but to be spaced from the drain region of high impurity concentration, so that a depletion layer extends sufficiently into the drain region of the low impurity concentration to prevent electric field concentration. However, the above-explained fabrication method has the problems that the steps for fabrication are quite complicated and the advantage of self-alignment is not effectively utilized.

SUMMARY OF THE INVENTION

The object of this invention is to provide a novel method for fabricating a MIS device in an offset gate configuration.

According to the present method, an offset gate MIS device is fabricated by forming an insulating film with a gate insulator portion as a part thereof on the surface of a semiconductor substrate having one conductivity type, providing a gate electrode on a portion of the insulating film, using the gate electrode as a mask to apply impurities of the other conductivity type to the surface of the semiconductor substrate through the insulating film, forming a shielding film on the surface of that portion of the insulating film which is near the gate insulator portion beneath the gate electrode, using the shielding film as a mask to remove an unmasked portion of the insulating film so as to selectively expose the surface of the semiconductor substrate, applying impurities of the other conductivity type with a second impurity concentration higher than the first impurity concentration to the exposed surface of the semiconductor substrate, and heating the resultant structure to diffuse the impurities into the semiconductor substrate to form source and drain regions therein.

DESCRIPTION OF THE PREFERRED EMBODIMENTS

The successive steps of the method of fabricating an offset silicon gate MIS device as an embodiment of this invention will be described below with the aid of FIGS. 1 to 8.

Figure 1:
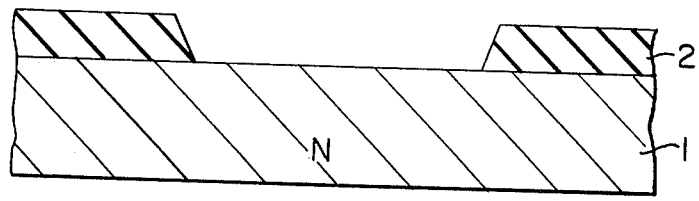
FIGS. 1 to 8 show in cross section the sequential steps of a method for fabricating an offset silicon gate MIS device as an embodiment of this invention.

FIG. 1: A field oxide (silicon oxide) film 2 is formed in the surface of an N-type silicon substrate 1 by thermally oxidizing the surface of the substrate 1 and the part of the silicon oxide film 2 on the surface of the area of the substrate which is to serve as an active region is removed by, for example, a photoetching technique.

Figure 2:
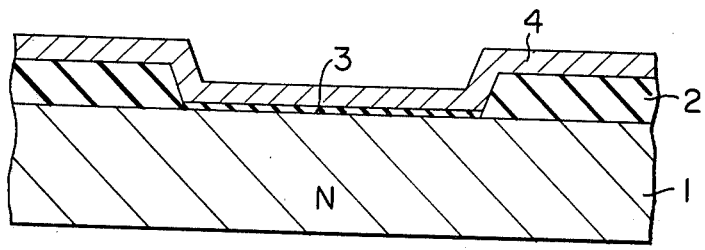

FIG. 2: The surface of the substrate area serving as the active region is thermally oxidized to form a silicon oxide film 3 having a thickness of about 1000 Å a part of which is used as a gate insulator film. Then, a polycrystalline silicon film 4 having a thickness of about 5000 Å a part of which is used as a gate electrode is formed on the films 2 and 3 by, for example, a CVD (chemical vapor deposition) technique.

Figure 3:
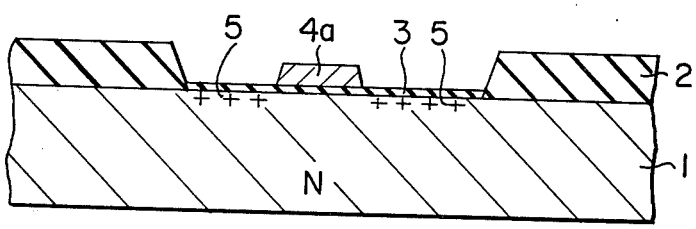

FIG. 3: The polycrystalline silicon film 4 is subjected to selective etching treatment by means of, for example, an etching solution containing HF and $HNO_3$ to form a gate electrode 4a. Then, with the gate electrode 4a used as a mask, P-type impurities, e.g. boron, 5 are applied to the surface of the substrate 1 through the silicon oxide film 3 by an ion implantation technique. In this case, with a boron ion implanting energy of 45 KeV and implanted boron atoms of $4 \times 10^{12}/cm^2$, a boron ion implanted layer having an impurity concentration of about $10^{17}$ atoms/cm$^3$ is formed. The boron impurities 5 are applied to form a drain layer in the offset portion of the element.

Figure 4:
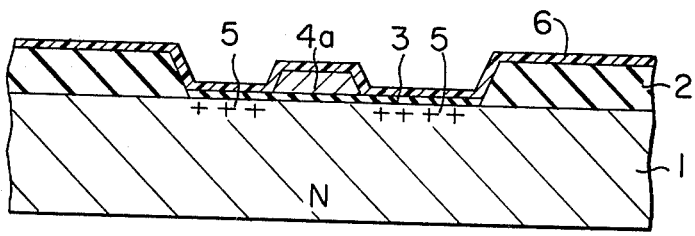
Figure 5:
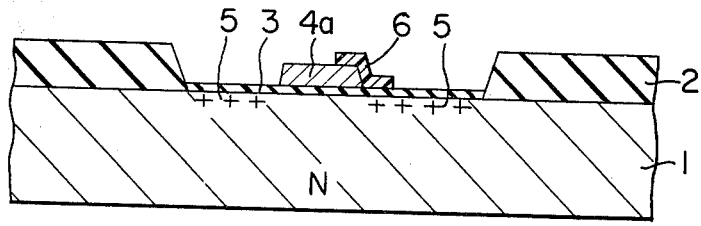
Figure 6:
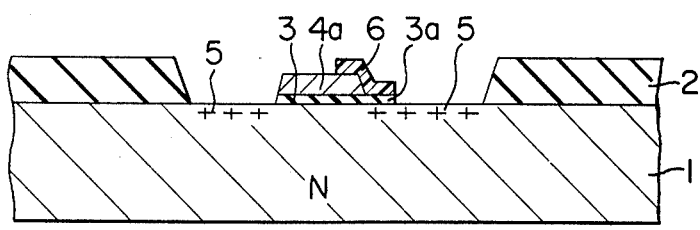

FIGS. 4, 5 and 6: The entire surface of the resultant structure is coated with a shielding film such as a photoresist film 6 as seen in FIG. 4. After the photoresist film has been removed in such a manner that the portion of the photoresist film 6 on the part of the silicon oxide film 3 as the offset portion is left behind, as shown in FIG. 5, the exposed part of the silicon oxide film 3 is removed by, for example, an etching solution containing $NH_4F$, with the part of the photoresist film 6 and the gate electrode 4a used as a mask, as shown in FIG. 6. As a result, a silicon oxide film 3a of the offset portion of the element is formed.

Figure 7:
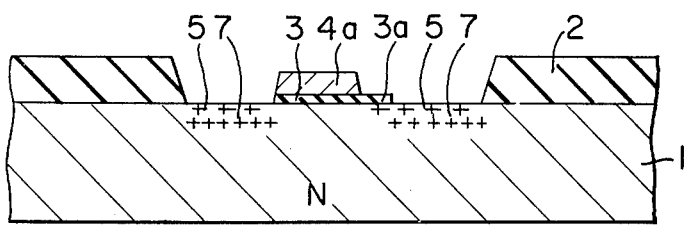

FIG. 7: After the photoresist film 6 has been removed, with the gate electrode 4a and the silicon oxide film 3a used as a mask, boron 7 as impurities having a concentration higher than that of the implanted boron atoms 5 is deposited on those portions of the silicon substrate 1 which serve as source and drain layers and on the gate electrode 4a. In this case, it should be noted that the boron 7 is not deposited under the silicon oxide film 3a of the offset portion.

Figure 8:
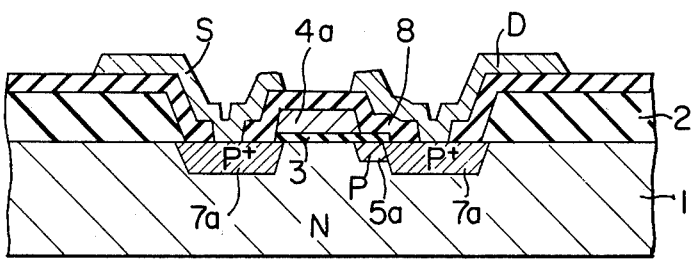

FIG. 8: The resultant structure is subjected to a heat treatment to diffuse the impurity boron 5 and 7 into the silicon substrate 1 so that $P^+$-type layers 7a serving respectively as source drain and layers and a P-type layer 5a as a drain layer in the offset portion are simultaneously formed. The following steps of the fabricating process are well known. Namely, a silicate glass (e.g. silicon oxide or phosphosilicate glass) film 8 as a surface protection or passivation film is formed by a CVD technique. After openings for electrodes or contacts have been provided in the film 8, a source electrode S, a drain electrode D and interconnection conductors (not shown) are formed through the vacuum deposition of aluminum and photoetching techniques.

The above-described method according to this invention and the silicon gate MIS device fabricated by the method have the following merits.

(1) The resultant MIS device is of offset gate configuration so that a depletion layer extending from the drain toward the channel expands sufficiently even near the surface of the silicon substrate 1. Consequently, no electric field concentration occurs in the region under consideration and therefore an element having a high breakdown voltage can be obtained.

(2) Since the offset gate structure is obtained easily and with high yield by providing the shielding film 6 such as a photoresist film on the silicon oxide film 3 of the offset portion after the gate electrode 4a has been formed, then the present method can be attained by only slightly modifying the conventional fabricating process. As a result, a silicon gate MIS device having a high breakdown voltage as well as high integration density and high speed switching operation characteristic of the silicon gate structure can be obtained.

This invention is by no means limited to the embodiment described above, but this invention can widely be applied to the method of fabricating a discrete element, an enhancement or depletion element or a complementary element which uses as a gate electrode material polycrystalline silicon or a refractory metal such as molybdenum, tangusten or platinum and uses various kinds of semiconductor wafers as a starting material.

Figure 9:
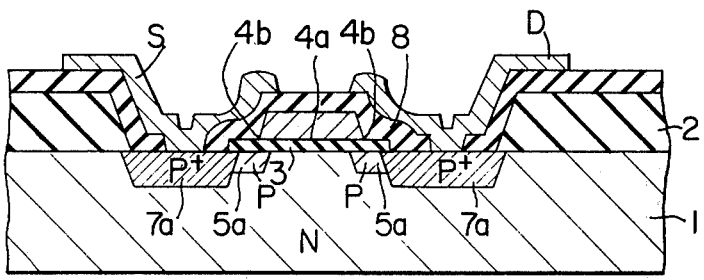
FIG. 9 shows in cross section an offset silicon gate MIS device as another embodiment of this invention.

In the above-described embodiment, the offset portion is provided only in the drain region, but offset portions may be provided for both source and drain regions, as shown in FIG. 9, by using the same method. Such a configuration is preferable especially in the case where high voltages are applied to both the source and drain regions. In the structure shown in FIG. 9, since the silicon oxide film 3 extends beyond the gate electrode 4a, the edge portions 4b of the gate electrode 4a are prevented from being subjected to damages such as cracks. In the case where a design is made such that the end of the gate electrode coincides with that of the silicon oxide film, there may be a possibility that the end portion of the silicon oxide film may be removed at the etching step, which may form a factor of crack of the edge portion of the gate electrode.

I claim:

1. In a method for fabrication of a MIS device comprising forming a gate insulator film and a gate electrode on a first area of the surface of a semiconductor substrate of a first conductivity type and using said gate electrode as a mask to apply impurities of a second conductivity type opposite to said first conductivity type to second and third areas of the semiconductor substrate surface at both the sides of said first area respectively so that source and drain regions are formed therein, the improvement comprising the step of forming said gate insulator film also on said second and third areas of the semiconductor substrate surface, the step of using said gate electrode as a mask to apply impurities of said second conductivity type with a first impurity concentration to said second and third areas of the semiconductor substrate surface through said gate insulator film, the step of forming a shielding film on a portion of said gate insulator film which is on at least one of said first and second areas of said substrate, said shielding film being adjacent to said gate electrode, the step of using said shielding film and said gate electrode as a mask to remove an unmasked portion of said gate insulator film which is exposed from said shielding film and said gate electrode thereby to selectively expose the surface of said semiconductor substrate, the second step of applying impurities of said second conductivity type with the applying parameters being modified relative to the first applying step so that the impurities applied by said second step will not penetrate through the gate insulator film, thereby to establish a second impurity concentration higher than said first impurity concentration in the exposed surface of said semiconductor substrate, and the step of heating the resultant structure to diffuse said impurities into said semiconductor substrate so that source and drain regions are formed therein, the portion of at least one of said source and drain regions under the portion of said gate insulator film near said gate electrode having a lower impurity concentration and the other portion of said one region having a higher impurity concentration.

2. A method as claimed in claim 1, wherein said shielding film is provided on both said second and third areas of the semiconductor substrate surface so that both said source and drain regions have the lower impurity concentration under the portions of said gate insulator film near said gate electrode.

3. In a method for fabrication of a MIS device comprising forming a gate insulator film and a gate electrode on a first area of the surface of a semiconductor substrate of a first conductivity type and introducing impurities of a second conductivity type opposite to said first conductivity type into second and third areas of the semiconductor substrate surface adjacent to the sides of said first area respectively using said gate electrode as a mask so that source and drain regions are formed therein, the improvement comprising the step of forming said gate insulator film also on said second and third areas of the semiconductor substrate surface, the step of introducing impurities of said second conductivity type into said second and third areas of the semiconductor substrate surface through said gate insulator film using said gate electrode as a mask to form lightly doped source and drain regions in said second and third areas, respectively, the step of forming a masking film adjacent to said gate electrode on said gate insulator film on the third area, the step of removing said gate insulator on said second and third areas which is exposed from said masking film and said gate electrode thereby to selectively expose the surface of said semiconductor substrate, and the second step of introducing impurities of said second conductivity type into said semiconductor substrate through the exposed portions of said second and third areas with the introducing parameters being modified relative to the first impurity introducing step so that the impurities applied by said second step will not penetrate through the gate insulator film, thereby to form heavily doped source and drain regions, respectively, said heavily doped drain region being adjacent to said lightly doped drain region.

4. A method as claimed in claim 3, wherein said gate insulator film is formed of a silicon oxide film, and said gate electrode is formed of a polycrystalline silicon film.

5. A method as claimed in claim 3, further comprising a step of removing said masking film before said step of introducing impurities of said second conductivity type.

6. In a method for fabrication of a MIS device comprising forming a gate insulator film and a gate electrode on a first area of the surface of a semiconductor substrate of a first conductivity type and using said gate electrode as a mask to apply impurities of a second conductivity type opposite to said first conductivity type to second and third areas of the semiconductor substrate surface at both the sides of said first area respectively so that source and drain regions are formed therein, the improvement comprising the step of forming said gate insulator film also on said second and third areas of the semiconductor substrate surface, the step of using said gate electrode as a mask to apply impurities of said second conductivity type with a first impurity concentration to said second and third areas of the semiconductor substrate surface through said gate insulator film, the step of forming a masking film on a portion of said gate insulator film which is on at least one of said first and second areas of said substrate, said masking film being adjacent said gate electrode, the step of using said masking film and a part of said gate electrode as a mask to remove an unmasked portion of said gate insulator film which is exposed from said masking film and said gate electrode thereby to selectively expose the surface of said semiconductor substrate, the step of removing said masking film, the step of applying impurities of said second conductivity type with a second impurity concentration higher than said first impurity concentration to the exposed surface of said semiconductor substrate, using said gate electrode and said portion of said gate insulator film as masks, and the step of heating the resultant structure to diffuse said impurities into said semiconductor substrate so that source and drain regions are formed therein, the portions of said source and drain regions under the portion of said gate insulator film near said gate electrode having a lower impurity concentration and the other portions of said source and drain regions having a higher impurity concentration.

7. A method as claimed in claim 6, wherein said masking film is provided on both said second and third areas of the semiconductor substrate surface so that both said source and drain regions have the lower impurity concentration under the portions of said gate insulator film near said gate electrode.

8. A method as claimed in claim 6, wherein said gate electrode is formed of a polycrystalline silicon, and said polycrystalline silicon is applied with said impurities of said second conductivity type during said step of applying impurities of said second conductivity type.

9. In a method for fabrication of a semiconductor device comprising the steps of:
providing a first layer on the surface of a semiconductor substrate of a first conductivity type;
providing a second layer on a portion of said first layer;
introducing the first impurities of a second conductivity type opposite to said first conductivity type through said first layer and into said semiconductor substrate using said second layer as a mask so as to form a first region having a first surface impurity concentration and a first depth; and a second step of introducing the second impurities of said second conductivity type, after the first impurities have been introduced and after exposing a part of said semiconductor substrate through said first layer, by using said first layer as a mask over a part of said first region with the introducing parameters being modified relative to the first impurity introducing step so that the impurities applied by said second step will not penetrate through the first layer, thereby to form a second region having a second surface impurity concentration higher than said first surface impurity concentration and a second depth deeper than said first depth.

10. A method as claimed in claim 9, wherein the surface impurity concentration of said second region is higher than that of said first region.

11. In a method for fabrication of a MIS device comprising forming a gate insulator film and a gate electrode on a first area of the surface of a semiconductor substrate of a first conductivity type and introducing impurities of a second conductivity type opposite to said first conductivity type into said semiconductor substrate through second and third areas of the semiconductor substrate surface adjacent to the sides of said first area respectively using said gate electrode as a mask so that source and drain regions are formed therein, the improvement comprising the step of forming said gate insulator film also on said second and third areas of the semiconductor substrate surface, the step of introducing impurities of said second conductivity type into said semiconductor substrate defined by said second and third areas through said gate insulator film using said gate electrode as a mask to form a first and a second semiconductor region with a first impurity concentration, the step of forming a shielding film adjacent to said gate electrode on said gate insulator film on said second area, the step of removing said gate insulator film on said second and third areas not covered with said shielding film and said gate electrode thereby to selectively expose the surface of said semiconductor substrate, the second step of introducing impurities of said second conductivity type into said semiconductor substrate through the exposed surfaces of said semiconductor substrate, and the step of heating said semiconductor substrate, wherein the introducing and heating parameters are set so that the impurities applied by said second step will not penetrate through the gate insulator film, thereby to form a third and a fourth semiconductor region with a second impurity concentration higher than said first impurity concentration in said semiconductor substrate.

12. A method as claimed in claim 11, wherein another shielding film is provided on said gate insulator film on said third area of the semiconductor substrate surface adjacent to said gate electrode in the step of forming said shielding film.

13. In a method for fabrication of a MIS device comprising forming a gate insulator film and a gate electrode on a first area of the surface of a semiconductor substrate of a first conductivity type and introducing impurities of a second conductivity type opposite to said first conductivity type into said semiconductor substrate through second and third areas of the semiconductor substrate surface adjacent to the sides of said first area respectively using said gate electrode as a mask so that source and drain regions are formed therein, the improvement comprising the step of forming said gate insulator film also on said second and third areas of the semiconductor substrate surface, the step of introducing impurities of said second conductivity type into said semiconductor substrate defined by said second and third areas through said gate insulator film using said gate electrode as a mask to form a first and a second semiconductor region with a first impurity concentration, the step of forming a masking film adjacent to said gate electrode on said gate insulator film on said second area, the step of removing said gate insulator film on said second and third areas not covered with said masking film and said gate electrode thereby to selectively expose the surface of said semiconductor substrate, and the second step of introducing impurities of said second conductivity type into said semiconductor substrate through the exposed surfaces of said semiconductor substrate with the introducing parameters being modified relative to the first impurity introducing step so that the impurities applied by said second step will not penetrate through the gate insulator film, thereby to form a third and a fourth semiconductor region with a second impurity concentration higher than said first impurity concentration in said semiconductor substrate.

14. In a method for fabrication of a MIS device comprising forming a gate insulator film and a gate electrode on a first area of the surface of a semiconductor substrate of a first conductivity type and introducing impurities of a second conductivity type opposite to said first conductivity type into said semiconductor substrate through second and third areas of the semiconductor substrate surface adjacent to the sides of said first area respectively using said gate electrode as a mask so that source and drain regions are formed therein.

the improvement comprising the step of forming said gate insulator film also on said second and third areas of the semiconductor substrate surface, the step of introducing impurities of said second conductivity type into said semiconductor substrate defined by said second and third areas through said gate insulator film using said gate electrode as a mask to form a first and a second semiconductor region with a first impurity concentration, the step of forming a masking film adjacent to said gate electrode on said gate insulator film on said second area, the step of removing said gate insulator film on said second and third areas not covered with said masking film and said gate electrode thereby to selectively expose the surface of said semiconductor substrate, the step of removing said masking film, the second step of depositing impurities of said second conductivity type on the exposed surfaces of said semiconductor substrate, wherein the impurity depositing step is subsequent to the first impurity introducing step, and the step of heating the resultant structure to diffuse said impurities into said semiconductor substrate, wherein the depositing and heating parameters are set so that the impurities applied by said second step will not penetrate through the gate insulator film so that a third and a fourth semiconductor region with a second impurity concentration higher than said first impurity concentration is formed therein.

15. A method as claimed in claim 14, wherein another masking film is provided adjacent to said gate electrode over said third area of the semiconductor substrate surface in the step of forming said masking film.

16. A method as claimed in claim 14, wherein said gate electrode is formed of a polycrystalline silicon, and said impurities of said second conductivity type are introduced into the gate electrode of said polycrystalline silicon during said step of introducing impurities of said second conductivity type.

17. In a method for fabrication of a MIS device comprising forming an insulator film on a first surface area of a semiconductor substrate of a first conductivity type, forming a gate electrode on said insulator film and introducing impurities of a second conductivity type opposite to said first conductivity type into said semiconductor substrate through second and third surface areas of the semiconductor substrate adjacent to the sides of said first surface area respectively using said gate electrode as a mask so that source and drain regions are formed therein, the improvement comprising the step of forming said insulator film on said second and third areas of the semiconductor substrate surface, the step of introducing impurities of said second conductivity type through said insulator into said semiconductor substrate defined by said second and third surface areas using said gate electrode as a mask to form a first and a second semiconductor region with a first impurity concentration, the step of forming a protection film adjacent to said gate electrode on said insulator film on said second surface area, the step of removing said insulator film on said second and third areas not covered with said protection film and said gate electrode thereby to selectively expose the surface of said semiconductor substrate, and the second step of introducing impurities of said second conductivity type into said semiconductor substrate into the exposed surfaces of said semiconductor substrate with the introducing parameters being modified relative to the first impurity introducing step so that the impurities applied by said second step will not penetrate through the gate insulator film, thereby to form a third and a fourth semiconductor region having a second impurity concentration higher than said first impurity concentration and a depth deeper than that of said first semiconductor region.

18. A method as claimed in claim 17, wherein said protection film comprises a photoresist film.

19. A method as claimed in claim 18, wherein said impurities of said second conductivity type are introduced into the gate electrode of said polycrystalline silicon during said step of introducing impurities of said second conductivity type.

20. A method for fabricating a semiconductor device comprising the steps of:
providing a first layer on the surface of a semiconductor substrate;
providing a second layer on a portion of said first layer;
selectively introducing first impurities into said semiconductor substrate through said first layer while using said second layer as a mask to form a first semiconductor region having a first surface concentration, and afterwards
the second step of selectively introducing second impurities into said semiconductor substrate through an opening in said first layer while using said first layer as a mask with the introducing parameters being modified relative to the first impurity introducing step so that the impurities applied by said second step will not penetrate through the gate insulator film, thereby to form a second semiconductor region having a second surface concentration higher than said first surface concentration.

21. A method as claimed in claim 20, wherein the depth of said second semiconductor region is deeper than that of said first semiconductor region.

22. A method as claimed in claim 20, wherein the conductivity type of said first impurities is the same as that of said second impurities.

23. A method for fabricating a semiconductor device comprising the steps of:
providing a first layer on the surface of a semiconductor substrate;
selectively forming a second layer on a portion of said first layer;
introducing first impurities into said semiconductor substrate through said first layer not covered with said second layer using said second layer as a mask to form a first semiconductor region; and afterwards
the second step of introducing second impurities into said semiconductor substrate after providing an opening in said first layer while using a remaining portion of said first layer as a mask with the introducing parameters being modified relative to the first impurity introducing step so that the impurities applied by said second step will not penetrate through the gate insulator film, thereby to form a second semiconductor region.

24. A method as claimed in claim 23, wherein said step of introducing said first impurities is effected by ion implantation.

25. A method as claimed in claim 23, wherein said first and said second impurities are the same conductivity type.

26. A method as claimed in claim 25, wherein the surface impurity concentration of said second semiconductor region is higher than that of said first semiconductor region.

27. A method as claimed in claim 26, wherein the depth of said second semiconductor region is deeper than that of said first semiconductor region.

28. A method for fabricating a semiconductor device comprising steps of:
providing a first layer on a semiconductor substrate;
selectively providing a second layer on a portion of said first layer;
introducing first impurities into said semiconductor substrate through said first layer not covered with said second layer so as to form a first semiconductor region in said semiconductor substrate;
selectively removing a portion of said first layer not covered with said second layer but spaced from said second layer so as to expose a portion of said semiconductor substrate; and
a second step of introducing second impurities into said exposed portion of the semiconductor substrate with the introducing parameters being modified relative to the first impurity introducing step so that the impurities applied by said second step will not penetrate through the gate insulator film, thereby to form a second semiconductor region in said semiconductor substrate.

29. A method as claimed in claim 28, wherein said first layer is formed of a silicon oxide layer, and said second layer is formed of a polycrystalline silicon.

30. A method for fabricating a semiconductor device comprising the steps of:

forming an insulating layer on a surface of a semiconductor substrate;

forming a silicon layer selectively covering a portion of said insulating layer;

selectively implanting first impurities through said insulating layer exposed by said silicon layer into said semiconductor substrate using at least an end portion of said silicon layer as a mask thereby to form a first semiconductor region at a surface portion of said semiconductor substrate not covered with said silicon layer; and the second step of introducing second impurities into said end portion of the silicon layer and a surface portion of said semiconductor substrate which is spaced from the surface portion of said semiconductor substrate underlying said end portion of the silicon layer and which is exposed by an opening in said insulating layer with the introducing parameters being modified relative to the impurity implanting step so that the impurities applied by the second step will not penetrate through the insulating layer, thereby to form a second semiconductor region adjacent to said first semiconductor region.

31. A method according to claim 1, 3, 6, 9, 11, 17, 20, 23, 28, or 30, wherein the impurity introducing steps are ion implantion steps with the energy level of the second ion implantation step being set lower than the first ion implantation step.

* * * * *